United States Patent [19]

Lur

[11] Patent Number: 5,604,148
[45] Date of Patent: Feb. 18, 1997

[54] PROCESS OF FABRICATING STACKED CAPACITOR CONFIGURATION FOR DYNAMIC RANDOM ACCESS MEMORY

[75] Inventor: Water Lur, Taipei, Taiwan

[73] Assignee: United Microelectronics Corporation, Hsinchu, Taiwan

[21] Appl. No.: 612,700

[22] Filed: Mar. 8, 1996

[51] Int. Cl.$^6$ ................................................ H01L 21/8242
[52] U.S. Cl. .............................. 437/60; 437/195; 437/919
[58] Field of Search .......................... 437/47, 60, 193, 437/195, 919; 148/DIG. 14

[56] References Cited

U.S. PATENT DOCUMENTS

| | | | |
|---|---|---|---|
| 5,399,518 | 3/1995 | Sim et al. | 437/919 |
| 5,457,063 | 10/1995 | Park | 437/919 |
| 5,480,824 | 1/1996 | Jun | 437/60 |
| 5,521,112 | 5/1996 | Tseng | 437/60 |

*Primary Examiner*—Chandra Chaudhari
*Attorney, Agent, or Firm*—Townsend and Townsend and Crew LLP

[57] ABSTRACT

A process of fabricating a capacitor configuration for DRAM devices is disclosed which has an increased capacitance and is structurally rigid. The process provides an umbrella-shaped capacitor configuration formed over the surface of a semiconductor substrate. The capacitor has an electrode surface area at least five times that of the conventional capacitor configuration based on the same physical dimension scales. The capacitor configuration for DRAM devices is easy to fabricate and may achieve a high fabrication yield rate as a result of its rigid structural configuration.

16 Claims, 5 Drawing Sheets

PROCESS OF FABRICATING STACKED CAPACITOR CONFIGURATION FOR DYNAMIC RANDOM ACCESS MEMORY

BACKGROUND OF THE INVENTION

1. Field of the Invention

The present invention generally relates to a process for fabricating capacitor configurations of dynamic random access memory (DRAM) devices. In particular, the present invention relates to a process for fabricating capacitor configurations of DRAM devices having increased capacitance thereof.

2. Technical Background

A primary use of capacitors in digital electronic circuitry is to hold binary electronic data. Due to the inevitable leakage in such capacitors, a larger capacitance means a more sustained holding of the data. Capacitor configurations having larger electrode surface area will have a relatively greater electrical capacitance because capacitance is directly proportional to the effective electrode surface area.

Unfortunately, enlarging the electrode surface area is contrary to the trend of reducing physical device dimensions. It is therefore inherently difficult to reduce the physical dimensions of the device while simultaneously maximizing the capacitor electrode surface area. In the past such efforts usually resulted in complicated fabrication procedures that suffer from low yield rates due to high reject rates.

A review of the conventional capacitor configuration for a typical DRAM device of the stacked capacitor configuration, such as that depicted in FIG. 1 of the drawing, will demonstrate this fabrication difficulty. As is seen in FIG. 1, the capacitor is fabricated over the silicon semiconductor substrate 10. A field oxide layer 11 is formed first, followed by the formation of the gate configuration 12 as well as the source/drain regions 18 to constitute the transistor element for the memory cell of the fabricated DRAM device. An oxide layer 13 is then formed over the surface of the transistor configuration, with a contact opening etched out of the oxide layer 13 over the designated area of the source/drain regions 18. A polysilicon layer 14 is next formed over the contact opening, followed by the formation of a dielectric layer 15 having a structural configuration such as, for example, an NO (nitride/oxide) or an ONO (oxide/nitride/oxide) configuration. A second polysilicon layer 16 is subsequently formed over the surface of the dielectric layer 15. This constitutes the capacitor configuration for the memory cell unit of the DRAM device. Finally, a metal configuration 17 is formed, along with the isolation layers not shown in the drawing, to generally conclude the fabrication of the integrated circuit device.

Such prior art memory cell unit construction with its incorporated capacitor configuration is limited in the capacitance it can provide, especially as memory devices such as DRAM's must be kept dimensionally small. As capacitance is inherently proportional to the surface area of the capacitor configuration, there is a drastic decrease in capacitance when the memory cell unit dimensions are reduced for the purpose of packing more memory capacity into the memory device.

Two basic approaches are apparent for increasing the capacitor capacitance in the fabrication of such memory devices. One approach is to reduce the thickness of the dielectric layer 15 sandwiched between the electrodes. The very thin dielectric layer 15 enhances the electric field intensity between the electrodes, namely the first and second polysilicon layers 14 and 16 separated by the dielectric layer 15 itself, thereby effectively increasing the amount of electrical charge that may be held between the electrodes.

However, this approach has its limitations. Direct carrier tunneling effect may result if the thickness of the dielectric layer 15 falls below less than 50 angstrom. Direct carrier tunneling causes excessive current leakage between electrode layers 14 and 16.

The other approach is to construct capacitors having a trenched configuration. Deep trenches are by etched into the lateral sides of the transistor units formed on the silicon substrate. These trenches constitute the curved surface of capacitor electrodes, thereby expanding the overall surface area of the capacitor configuration thus constructed. However, the formation of deep trenches is difficult. As the etching aspect ratio increases, the time required for etching becomes excessively long and there is further the inevitable side effect of an increased defect rate which increases current leakage in the capacitor.

Improved, stacked capacitor configurations have also been proposed which employ improved morphology for the electrode surfaces of the capacitor configuration. The resultant non-uniform surface of the capacitor electrodes expands the effective surface area of the capacitor, thereby increasing its effective capacitance. Several previously proposed improved stacked capacitor configurations are shown in FIGS. 2, 3 and 4. In these drawing figures, reference numerals 14, 15 and 16 designate the first polysilicon layer, the dielectric layer, and the second polysilicon layer, respectively, of the capacitor configuration.

In general, when compared with the structural capacitor configuration of FIG. 1, the configurations shown in FIGS. 2, 3 and 4 have an increased capacitor electrode surface area for an enhanced capacitance. However, the extent to which the capacitance can be increased is limited to about three-fold, which is insufficient for and incompatible with the required degree of device dimension reduction. Furthermore, these capacitor configurations, as mentioned above, require complicated and difficult fabrication procedures.

SUMMARY OF THE INVENTION

It is therefore a primary object of the present invention to provide a process for fabricating capacitor configuration for DRAM devices having an electrode surface area at least five times that of conventional capacitors having otherwise the same physical dimensions.

The present invention achieves this with a process involving the steps of: (a) forming a field oxide layer, transistor component and a first insulating layer over a semiconductor substrate, the transistor component including a gate and source/drain regions; (b) thereafter forming at least a first electrically conducting layer and a second insulating layer subsequently on the first insulating layer, the second insulating layer including upper and lower insulating layers; (c) forming a contact opening at a designated location through the first insulating layer, the first electrically conducting layer and the second insulating layer to expose the surface of the substrate; (d) forming a second electrically conducting layer inside the contact opening, and removing the upper insulating layer of the second insulating layer; (e) forming a spacing layer over the lower insulating layer of the second insulating layer and surrounding the second electrically conducting layer, the spacing layer configuration including a combination of at least an insulating layer and an electrically conducting layer arranged in vertically alternate order; (f) etching back the insulating layers of the spacing layer configuration to form recesses defining a multiple, ring-shaped wall configuration having recesses therein; (g) forming a third electrically conducting layer over the top surface of the ring-shaped wall configuration, and etching into the ring-shaped wall configuration and the lower insulating layer of the second insulating layer for defining the pattern of the capacitor configuration; (h) removing the lower insulating layer of the second insulating layer and the insulating layers in the spacing layer configuration; (i) anisotropically etching into the first electrically conducting layer, and constructing the lower electrode for the capacitor configuration utilizing the first, second and third electrically conducting layers and the electrically conducting layer of the spacing layer configuration; (j) forming a dielectric layer over the surface of the lower electrode; and (k) forming a fourth electrically conducting layer over the surface of the dielectric layer as the upper electrode of the capacitor.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
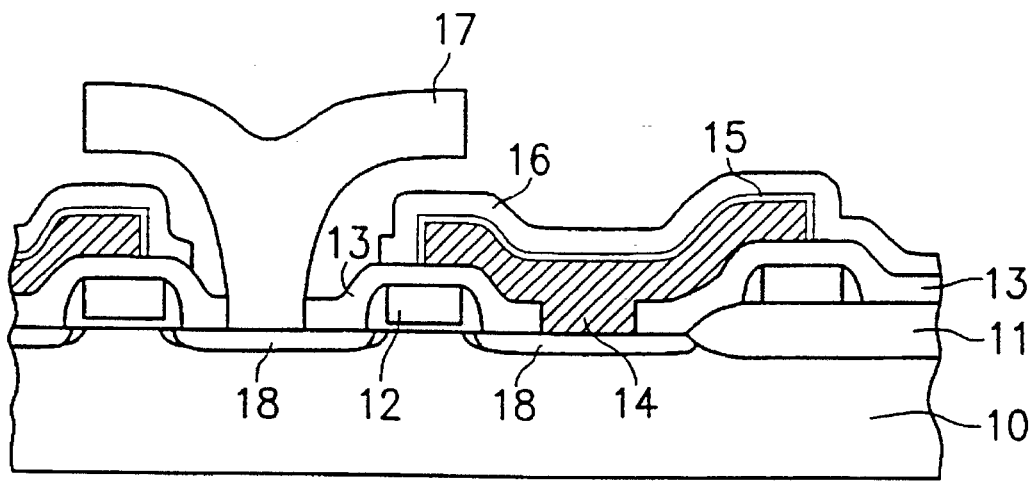
FIG. 1 schematically shows a selected cross section of the conventional stacked capacitor configuration for DRAM devices.
Figure 2:
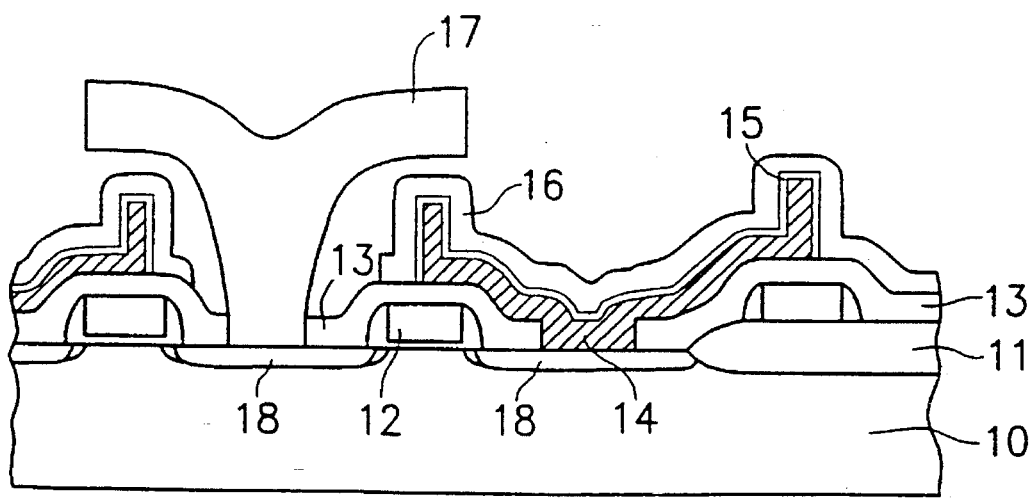
FIG. 2 schematically shows a selected cross section of an improved version of the conventional stacked capacitor configuration for DRAM devices.
Figure 3:
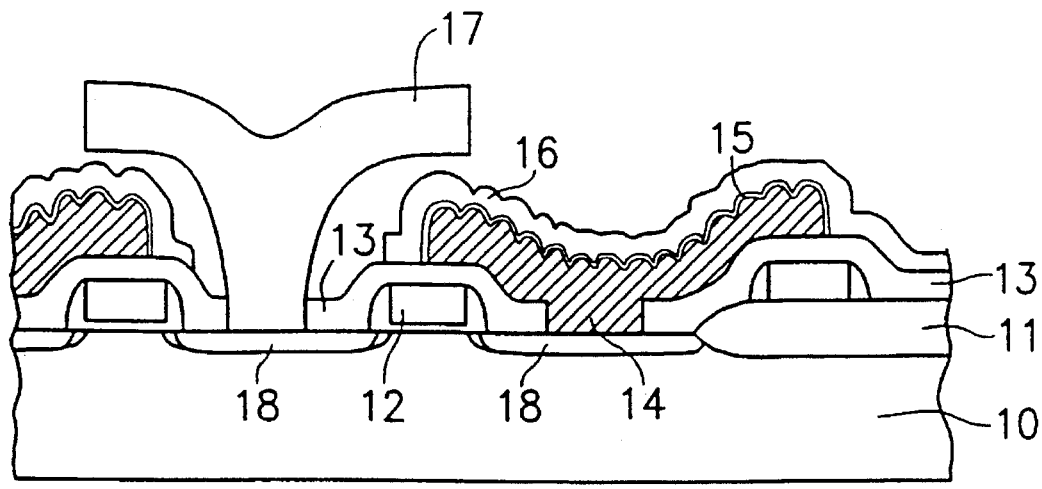
FIG. 3 schematically shows a selected cross section of another improved version of the conventional stacked capacitor configuration for DRAM devices.
Figure 4:
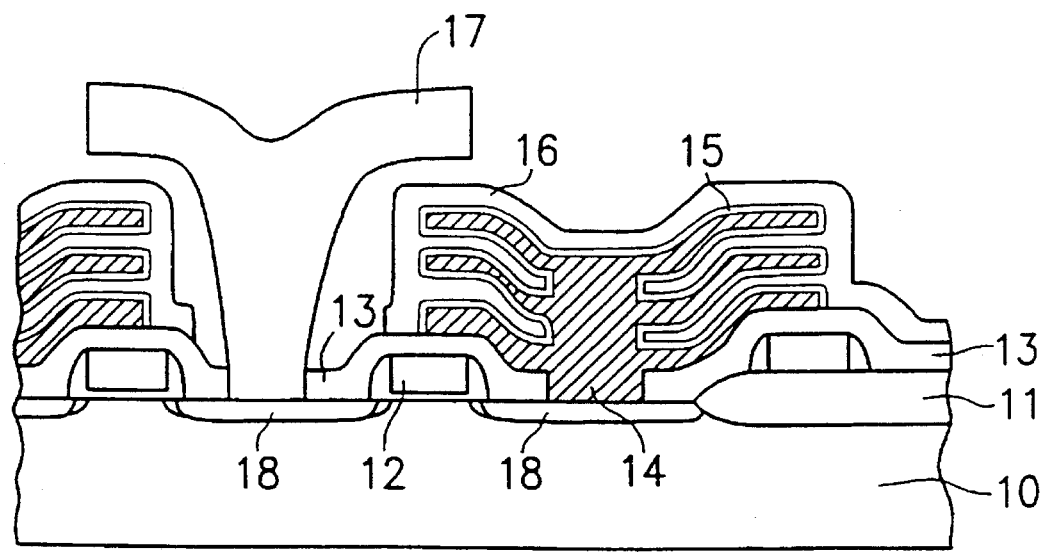
FIG. 4 schematically shows a selected cross section of still another improved version of the conventional stacked capacitor configuration for DRAM devices.

The process of fabricating a capacitor configuration for DRAM devices in accordance with the present invention is carried out on a semiconductor silicon substrate 10 similar to the one shown in FIG. 1 on which a field oxide layer 11 and a transistor unit for the memory cell including a gate 12 and source/drain regions 18 are formed. For simplicity, this overall semiconductor configuration is identified by reference numeral 20 in FIG. 5.

Referring to FIGS. 5A–5E, before the capacitor can be fabricated, a first insulating layer 23 is formed on the surface of substrate 20 as an inter-layer dielectric (ILD). The ILD isolates the capacitor to be fabricated from the other components already fabricated in the substrate.

Step 1

Figure 5A:
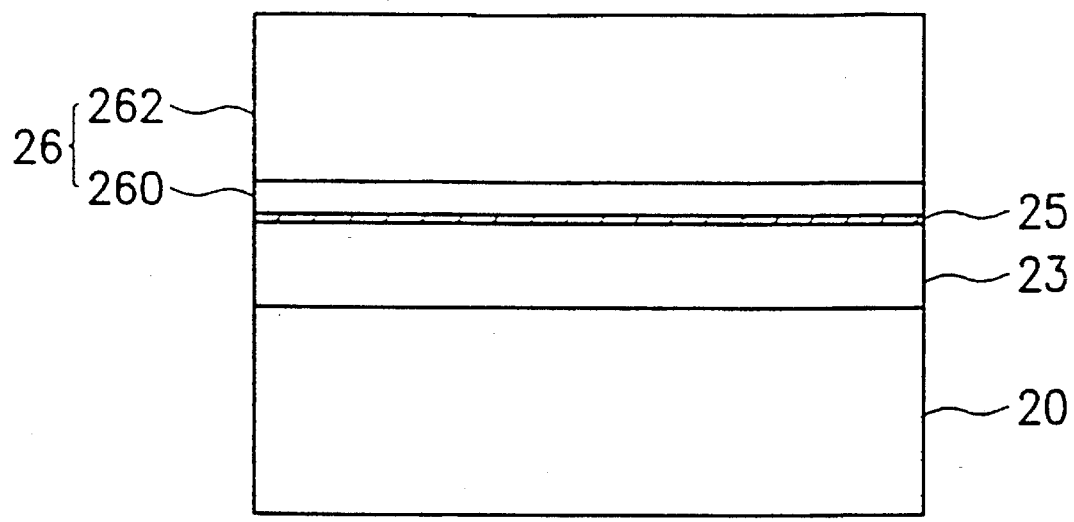
FIGS. 5A–5E schematically show cross-sectional views of the stacked capacitor configuration for DRAM devices as they appear during selected steps in the fabrication process of a preferred embodiment of the present invention.

Referring to FIG. 5A, a first electrically conducting layer 25 and a second insulating layer 26 are sequentially formed over the surface of the first ILD insulating layer 23. The second insulating layer 26 includes a lower insulating layer 260 and a upper insulating layer 262.

This can be achieved, for example, by first depositing a layer of tetra-ethyl-ortho-silicate (TEOS) oxide with a chemical vapor deposition (CVD) procedure that is either implanted with impurities or not so that the first insulating layer 23 has a thickness of, for example, 2,000–10,000 angstroms. The first electrically conducting layer 25 is next formed by depositing a thin polysilicon layer of a thickness of, for example, about 200–2,000 angstroms over the surface of the second insulating layer 23. A thin layer of nitride 260 having a thickness of, for example, about 500–2,000 angstroms is then deposited over the surface of the first electrically conducting layer 25, followed by the deposition of another thin oxide layer 262 with a thickness of, for example, about 3,000–8,000 angstroms. The nitride 260 and oxide 262 layers together constitute the second insulating layer 26.

Step 2

Figure 5B:
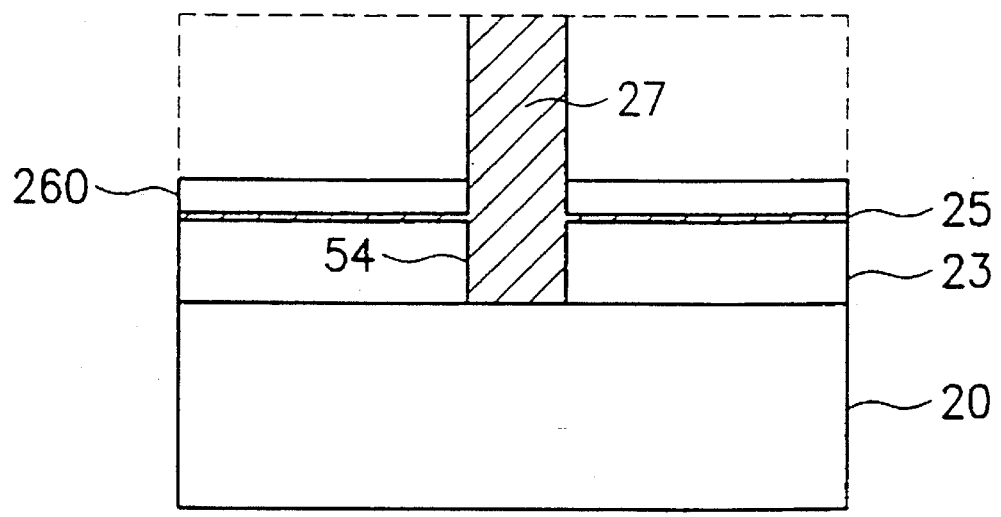

Referring to FIG. 5B, a contact opening 54 is formed at a designated location through the first insulating layer 23, the first electrically conducting layer 25 and the second insulating layer 26 to thereby expose the surface of substrate 20. The entire cavity formed by the contact opening 54 is then filled with an electrically conducting material to form a second electrically conducting layer 27 as shown in the drawing. Thereafter upper insulating layer 262 of the second insulating layer 26 is removed entirely.

This can be achieved, for example, by employing a photolithographic procedure that includes the use of a reactive ion etching (RIE) process to define the desired pattern for the contact opening 54 on the exposed surface of the upper insulating layer 262. The three layers 23, 25 and 26 within the confines of opening 54 are removed entirely to expose the surface of the source/drain regions of the memory cell transistor unit (not shown in FIG. 5) in substrate 20. After the contact opening 54 has been formed, a CVD procedure, followed by etching back, is employed to fill the insides of the cavity defined by opening 54 with a polysilicon layer 27. The upper insulating oxide layer 262 of the second insulating layer 26 acts as the etch stop and is stripped with a diluted hydrofluoric (HF) acid solution after the polysilicon layer 27 has been formed as is shown in FIG. 5B.

Step 3

Figure 5C:
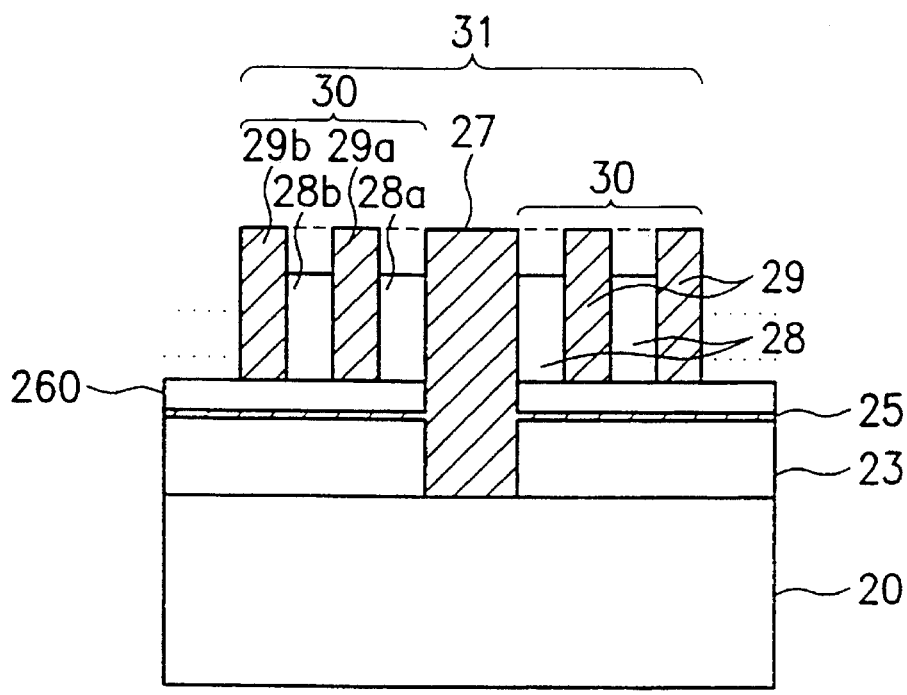

Referring to FIG. 5C, a multiple ring-shaped wall configuration 31 is formed concentrically about the second electrically conducting layer 27 by initially forming a spacing layer configuration 30 which includes at least one insulating layer 28 and one electrically conducting layer 29 arranged in sequential vertical interlacing order. Insulating layers 28 are then etched back to form recesses.

This is done, for example, by employing a deposition and etching-back procedure to sequentially form an oxide layer 28a, a polysilicon layer 29a, an oxide layer 28b, and polysilicon layer 29b, thereby constructing the spacing layer configuration 30. Each of the conducting polysilicon and insulating oxide layers of the spacing layer 30 has a thickness in the range of, for example, about 500–2,000 angstroms. The fact that etching stops at nitride layer 260 provides good protection for the first polysilicon layer 25. An etchback procedure briefly etches into the oxide layers 28a and 28b, forming recesses with a depth, for example, of about 500–3,000 angstrom. The multiple ring-shaped wall 31 with the recesses is therewith formed.

The above-mentioned etchback procedure may employ a dry etching process using fluoride chemicals, or may involve briefly dipping in a diluted HF acid solution. For example, with a diluted HF acid solution having a 1:10 concentration ratio, a 300 angstrom etching rate into a silicon oxide layer can be achieved. The number of conducting layer/insulating layer combinations in spacing layer 30 may be varied based on the required amount of capacitance.

However, the number of conducting/insulating layers in the spacing layer 30 may not be expanded without limitation. In memory cell units of high-density DRAM devices, each basic memory cell unit has a surface area of less than 1 µm². For example, in the fabrication of 256 M-bit DRAM devices, each memory cell is required to occupy less than 0.8 µm². Therefore, for example, if the diameter of the contact opening 54 is 0.25 µm, with the adequate thickness of the subsequently deposited conducting/insulating layers of about 1,000 angstroms, a spacing layer 30 having four deposited conducting/insulating layers would fill the entire space. In this case, a spacing layer 30 with only two polysilicon walls 29a and 29b in the multiple ring-shaped wall 31 can be formed about contact opening 54.

Step 4

Figure 5D:
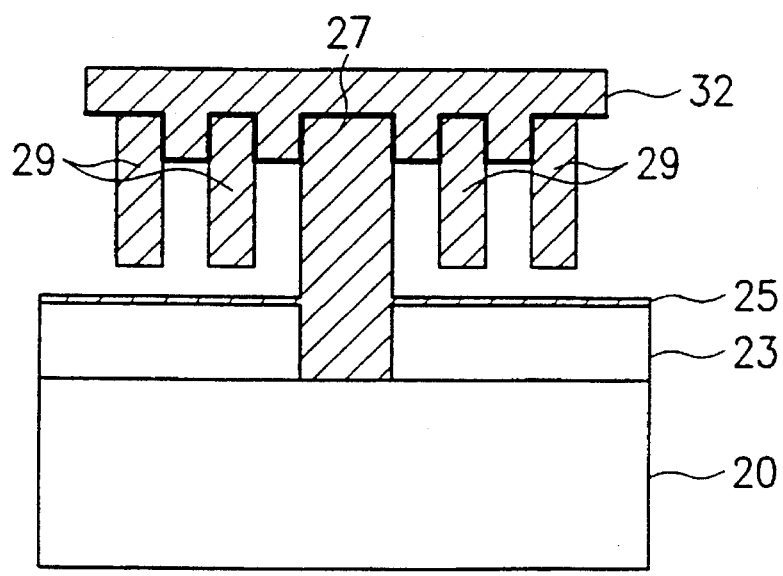

Referring next to FIG. 5D, a third electrically conducting layer 32 is formed which covers the multiple ring-shaped wall 31 and extends into the recesses thereof. The lower insulating layer 260 of the insulating layer 26, as well as insulating layers 28a and 28b, are then removed.

This is done, for example, by first depositing a third polysilicon layer 32 on top of the multi-ring wall 31. Since the recesses in the surface of multi-ring wall 31 are filled with polysilicon, a tight and secure matching between the third conducting layer 32 and the multi-ring wall 31 is assured. Polysilicon layers 27, 29 and 32, the oxide layer 28, and the nitride layer 260 are then subjected to a photolithography procedure and subsequently to dry etching to define the contour for the capacitor configuration. Nitride layer 260 and oxide layer 28 of the spacing layer 30 are then removed with suitable chemical solutions. For example, a phosphoric acid solution may be employed to remove the nitride layer 260, while a diluted HF acid solution may be employed to remove the oxide layer 28. Since etching stops at the polysilicon layer 25, the first insulating layer 23 is protected.

Step 5

Figure 5E:
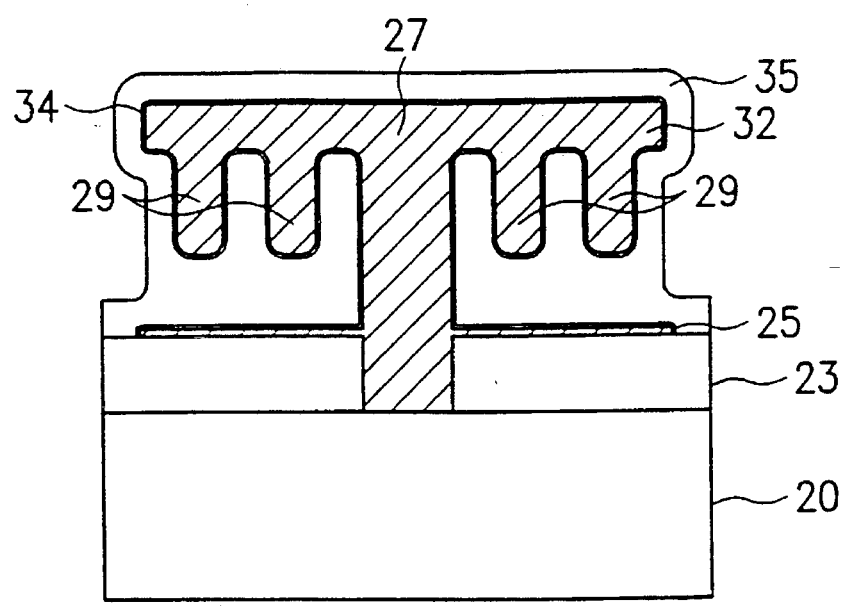
Figure 6:
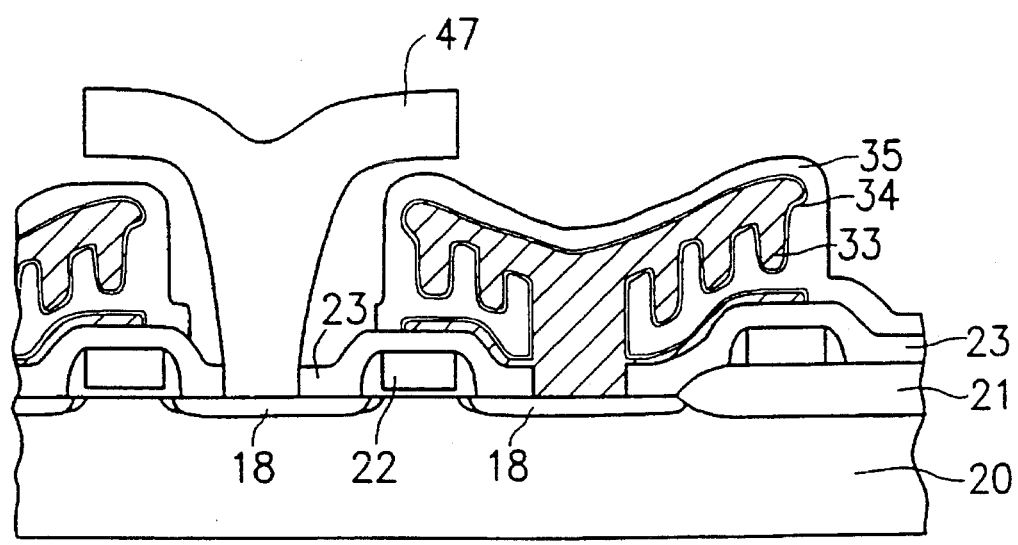
FIG. 6 schematically shows a cross-sectional view of the DRAM device having a stacked capacitor configuration which has been fabricated in accordance with the process of the present invention.

Referring next to FIGS. 5E and 6, the first electrically conducting layer 25 is an-isotropically etched into so that it and the electrically conducting layers 27, 29 and 32 define a lower electrode 33 of the capacitor. A dielectric layer 34 is then formed over the surface of the lower electrode 33, followed by the formation of a fourth electrically conducting layer 35 over the surface of the dielectric layer 34. The fourth conducting layer serves as the upper electrode 35 for the capacitor. This generally concludes the fabrication of the capacitor for the memory device.

The above is achieved, for example, by first briefly etching with a RIE procedure into the thin polysilicon layer 25 to obtain the configuration shown in FIG. 5E. The polysilicon layers 25, 27 and 32, as well as the polysilicon layer 29 of spacing layer 30, together constitute the lower electrode 33 which has an umbrella-like shape. A thin layer of dielectric 34 is then formed on the surface of the lower electrode 33 by depositing thereon nitride/oxide, oxide/nitride/oxide, tantalum oxide ($Ta_2O_5$), strontium titanate, barium titanate, or any other dielectric material suitable for the use as the dielectric material of a capacitor. Thereafter, polysilicon layer 35 is deposited over the surface of the dielectric layer 34 which can be employed as the upper electrode for the fabricated capacitor.

Finally, a contact opening is formed in the dielectric layer at a designated location, allowing the plating formation of a conducting metal wire 47, and a protective isolating layer is applied as is known and conventional in the fabrication for capacitors. The result is a configuration as shown in FIG. 6. The capacitor configuration features an umbrella-like shape that is characterized by increased capacitance.

The capacitor configuration of the present invention as described above and depicted in the accompanying drawing is structurally secure and sound and offers improved capacitance. Both are direct results of the umbrella-shaped capacitor configuration described above.

Moreover, alongside the second electrically conducting layer 27, oxide and polysilicon layers may be deposited alternately to form an enhanced spacing layer configuration, so that an improvement in capacitance of up to five-fold may be achieved relative to devices of the same physical dimension made according to the prior art. This makes the construction of the present invention particularly suitable for the miniaturization requirements of mass memory devices.

What is claimed is:

1. A process of fabricating a capacitor configuration for a dynamic random access memory device over a semiconductor substrate comprising the steps of:

(a) forming a field oxide layer, transistor component and a first insulating layer on said substrate, said transistor component including a gate and source/drain regions;

(b) sequentially forming at least a first electrically conducting layer and a second insulating layer on said first insulating layer, said second insulating layer including an upper insulating layer and a lower insulating layer;

(c) forming a contact opening at a designated location through said first insulating layer, said first electrically conducting layer and said second insulating layer so that said contact opening exposes a surface of said substrate;

(d) forming a second electrically conducting layer inside said contact opening, and removing said upper insulating layer of said second insulating layer;

(e) forming a spacing layer configuration over said lower insulating layer of said second insulating layer and surrounding said second electrically conducting layer, said spacing layer configuration including a combination of at least an insulating spacing layer and an electrically conducting layer from the second electrically conducting layer;

(f) etching back said insulating layers of said spacing layer configuration to thereby form a multiple ring-shaped wall configuration having at least one recess therein;

(g) forming a third electrically conducting layer over a top surface of said ring-shaped wall configuration having at least one recess;

(h) etching into said ring-shaped wall configuration and said lower insulating layer of said second insulating layer for defining a pattern of said capacitor configuration by removing said lower insulating layer of said second insulating layer and said insulating layers in said spacing layer configuration;

(i) an-isotropically etching into said first electrically conducting layer;

(j) constructing a lower electrode for said capacitor configuration utilizing said first, second and third electrically conducting layers and said electrically conducting layer of said spacing layer configuration;

(k) forming a dielectric layer over said lower electrode; and (l) forming a fourth electrically conducting layer over said dielectric layer as an upper electrode for said capacitor configuration.

2. The process of fabricating the capacitor configuration of claim 1, wherein step (a) comprises forming said first insulating layer as a tetra-ethyl-orthosilicate (TEOS) oxide layer having a thickness of about 2,000–10,000 angstroms.

3. The process of fabricating the capacitor configuration of claim 1, wherein step (b) comprises forming said first electrically conducting layer as a polysilicon layer having a thickness of about 200–2,000 angstroms.

4. The process of fabricating the capacitor configuration of claim 1, wherein step (b) comprises forming said lower insulating layer of said second insulating layer as a nitride layer having a thickness of about 500–2,000 angstroms.

5. The process of fabricating the capacitor configuration of claim 1, wherein step (b) comprises forming said upper insulating layer of said second insulating layer as an oxide layer having a thickness of about 3,000–8,000 angstroms.

6. The process of fabricating the capacitor configuration of claim 1, wherein step (d) comprises forming said second electrically conducting layer as a polysilicon layer.

7. The process of fabricating the capacitor configuration of claim 1, wherein step (e) comprises forming said insulating layer in said spacing layer configuration as an oxide layer having a thickness of about 500–2,000 angstroms.

8. The process of fabricating the capacitor configuration of claim 1, wherein step (e) comprises forming said electrically conducting layer in said spacing layer configuration as a polysilicon layer having a thickness of about 500–2,000 angstroms.

9. The process of fabricating the capacitor configuration of claim 5, wherein said upper insulating layer of said second insulating layer formed in step (d) is removed by etching with diluted hydrofluoric (HF) acid solution.

10. The process of fabricating the capacitor configuration of claim 7, wherein the step of etching back said insulating layer in said spacing layer configuration to form said at least one recess comprises one of dry etching utilizing fluoride and dipping in a diluted hydrofluoric (HF) acid solution.

11. The process of fabricating the capacitor configuration of claim 1, wherein step (g) comprises forming said third electrically conducting layer as a polysilicon layer matching said recess.

12. The process of fabricating the capacitor configuration of claim 4, wherein said lower insulating layer of said second insulating layer removed in step (h) is removed by etching in a phosphoric acid solution.

13. The process of fabricating the capacitor configuration of claim 1, wherein said insulating layer of said spacing layer configuration removed in step (h) is removed by etching in a diluted hydrofluoric (HF) acid solution.

14. The process of fabricating the capacitor configuration of claim 1, wherein step (k) comprises forming said dielectric layer of a material selected from the group consisting of nitride/oxide, oxide/nitride/oxide, tantalum oxide, barium titanate and strontium titanate.

15. The process of fabricating the capacitor configuration of claim 1, wherein step (l) comprises forming said fourth electrically conducting layer as a polysilicon layer.

16. The process of fabricating the capacitor configuration of claim 1, including the step of giving said capacitor configuration an umbrella-shaped configuration.

* * * * *